(12) United States Patent
Hsieh et al.

(10) Patent No.: US 8,394,721 B2
(45) Date of Patent: Mar. 12, 2013

(54) METHOD FOR OBTAINING A LAYOUT DESIGN FOR AN EXISTING INTEGRATED CIRCUIT

(75) Inventors: Ming-Teng Hsieh, New Taipei (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 76 days.

(21) Appl. No.: 13/104,986

(22) Filed: May 11, 2011

(65) Prior Publication Data
US 2012/0289048 A1    Nov. 15, 2012

(51) Int. Cl.
*H01L 21/311* (2006.01)

(52) U.S. Cl. ........... 438/697; 438/692; 438/748; 216/92

(58) Field of Classification Search ........... 438/113, 438/114, 690, 691, 692, 693, 697, 131, 747, 438/748; 216/88, 90, 89, 92
See application file for complete search history.

(56) References Cited

U.S. PATENT DOCUMENTS

| | | | |
|---|---|---|---|
| 6,695,682 B2* | 2/2004 | Sato et al. | 451/8 |
| 2005/0196964 A1* | 9/2005 | Smith et al. | 438/692 |
| 2007/0000873 A1* | 1/2007 | Kubota et al. | 216/88 |
| 2010/0119782 A1* | 5/2010 | Ohgane | 428/174 |

\* cited by examiner

*Primary Examiner* — Lan Vinh
(74) *Attorney, Agent, or Firm* — Winston Hsu; Scott Margo

(57) ABSTRACT

A method for obtaining a layout design for an existing integrated circuit, in which, an integrated circuit die is polished with a tilt angle to form an inclined polished surface and one or more images of the inclined polished surface are obtained. The images may be overlapped directly, or the image or the images may be utilized to provide information to obtain a layout design comprising at least one repeating unit structure of the layout structure.

12 Claims, 8 Drawing Sheets

METHOD FOR OBTAINING A LAYOUT DESIGN FOR AN EXISTING INTEGRATED CIRCUIT

BACKGROUND OF THE INVENTION

1. Field of the Invention

The present invention generally relates to obtaining a layout design of an existing integrated circuit, and, more particularly, to obtaining a layout design of an existing integrated circuit comprising an array of repeating unit structures.

2. Description of the Prior Art

In the semiconductor industry, it is usually desired to be able to inspect an existing integrated circuit (IC) for obtaining design and/or layout information thereof. The inspection may be useful for, for example, correcting errors in circuit design, functionality, layout connectivity, etc for fabricating a semiconductor circuit, especially a large-scale one, or, for example, reverse engineering an existing IC to extract layout or design information. For the inspection, referring to FIG. 1, for example, the die including the IC is deconstructed by a sequence of layer-removal processes, to reveal components 4a, 4b, 4c in various layers 6, 8, 10 step-by-step. The layer-removal processes may be for example a sequence of etching steps to reveal a single element in, such as an interconnecting metal layer, a polycrystalline silicon layer, an oxide layer, a silicide layer, etc., and/or a sequence of polishing steps to reveal components on each polished surface.

However, in addition to time consuming for both etching and polishing procedure for revealing the IC layout structure layer by layer, some components or elements may be not seen due to being covered by others, and when the structure is polished step-by-step, elements revealed in a single polished surface do not provide sufficient information about vertical spatial relations of each other. For example, when word lines or bit lines are revealed on one surface, capacitors are not be seen, and little clues are shown for the relative position between the word lines and the capacitor or between the bit lines and the capacitors. These are disadvantages for analyzing the exact structure. Furthermore, certain components or elements in the IC may tend to be etched off or polished off in one single step of removal without awareness so as to result in an erroneous layout structure.

Therefore, there is still a need for a novel method for obtaining a layout design of an existing integrated circuit fast, efficiently and accurately.

SUMMARY OF THE INVENTION

An objective of the present invention is to provide a method for obtaining a layout design for an existing integrated circuit fast, efficiently and accurately.

According to an embodiment of the present invention, a method for obtaining a layout design for an existing integrated circuit comprises steps as follows. An integrated circuit die comprising a layout structure of an integrated circuit and a dielectric filling is provided. The layout structure comprises an array of repeating unit structures. The integrated circuit die is polished with a tilt angle to form an inclined polished surface. A plurality of images for a plurality of regions of the inclined polished surface is obtained. The images are overlapped to obtain a layout design comprising at least one repeating unit structure of the layout structure.

According to another embodiment of the present invention, after the plurality of images for the plurality of regions of the inclined polished surface is obtained as aforementioned, a layout design comprising at least one repeating unit structure of the layout structure is obtained using information provided by the images.

According to further another embodiment of the present invention, one image of the region of the inclined polished surface as aforementioned is obtained and the region comprises a plurality of the repeating unit structures. The layout design comprising at least one repeating unit structure of the layout structure is obtained using information provided by the image.

These and other objectives of the present invention will no doubt become obvious to those of ordinary skill in the art after reading the following detailed description of the preferred embodiment that is illustrated in the various figures and drawings.

DETAILED DESCRIPTION

Referring to FIGS. 2 to 5, a method for obtaining a layout design for an existing integrated circuit according to one embodiment of the present invention comprises steps as follows. First, an integrated circuit die is provided. The integrated circuit die comprises a layout structure of an integrated circuit and a dielectric filling. Herein, the dielectric filling is dielectric material filled among the layout structure of the integrated circuit. The integrated circuit die may be a conventional one or include an unknown layout of an integrated circuit, which may draw the attention of the industry. The layout structure may include an array of repeating unit structures. The repeating unit structure may include for example a memory cell array structure, such as RAM (DRAM or SRAM), ROM, Flash memory, and the like, but not limited thereto.

Figure 1:
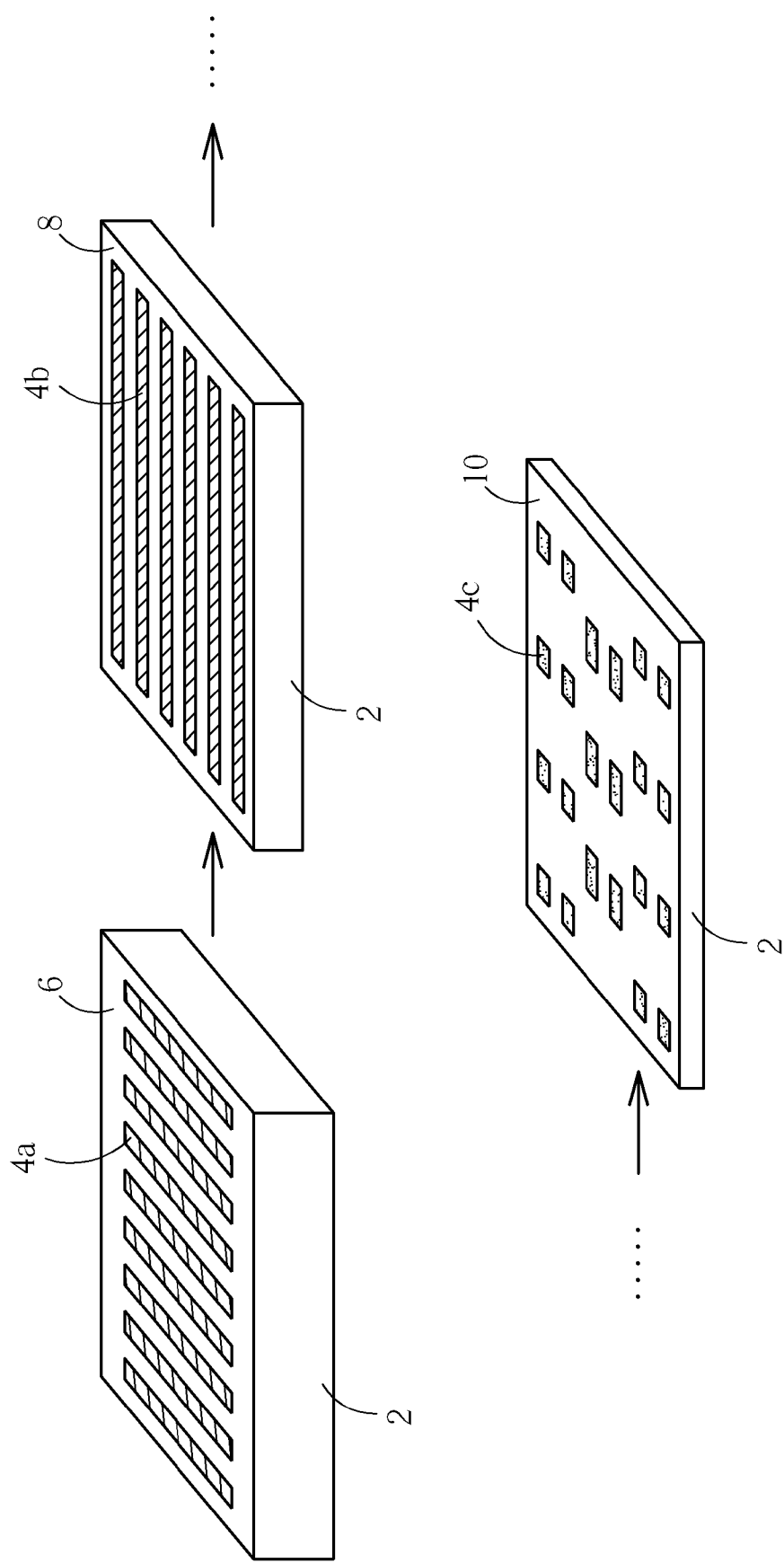
FIG. 1 is a schematic diagram illustrating a conventional method of analyzing an integrated circuit for obtaining the layout design.
Figure 2:
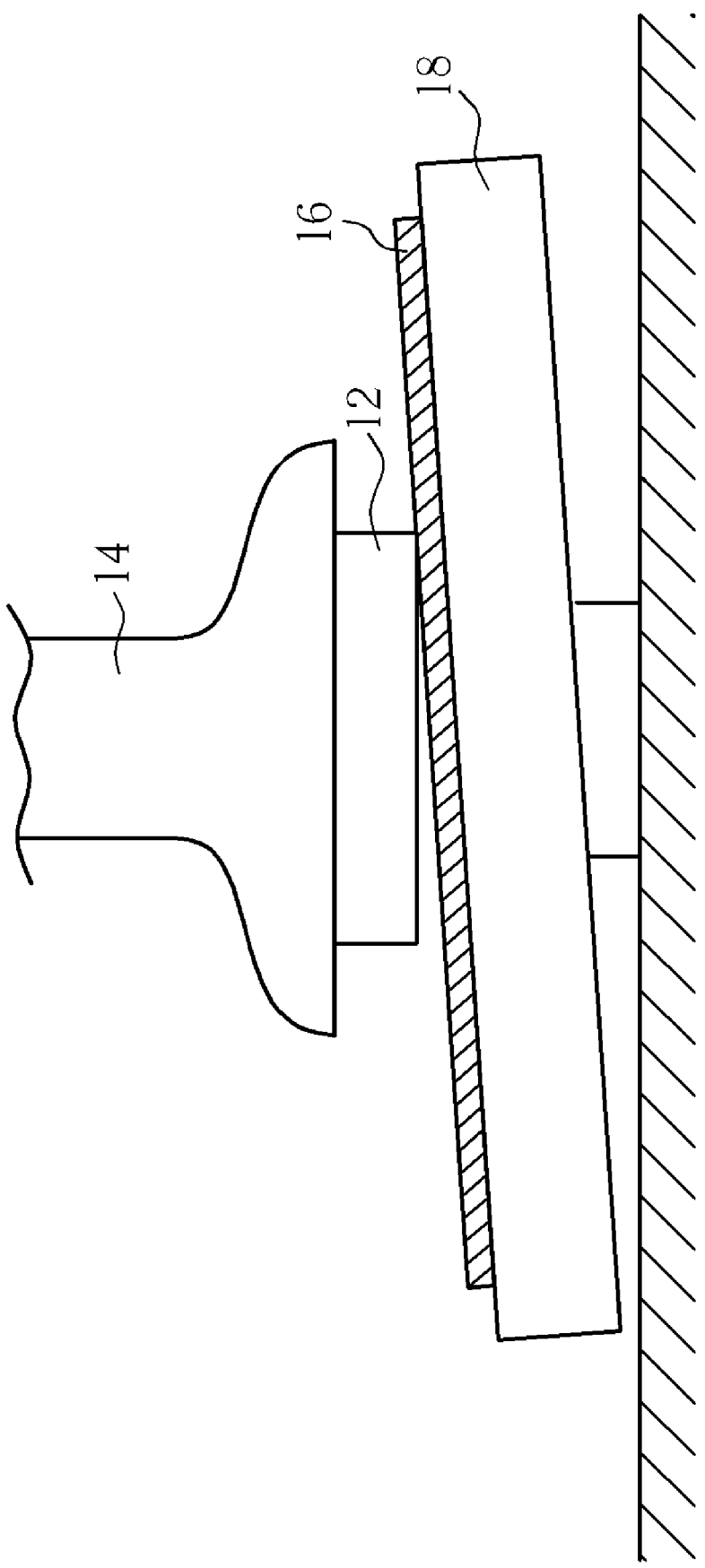
FIG. 2 is a schematic diagram illustrating an embodiment of polishing in the present invention.

Next, the integrated circuit die is polished with a tilt angle to form an inclined polished surface. One embodiment for the polishing with a tilt angle may be as shown in FIG. 2, in which an integrated circuit die 12 is carried by a holder or polishing head 14 to be polished on a polishing pad 16 on a stage or stand or holder 18. The polishing may be performed using a conventional chemical-mechanical polishing (CMP) tool. The polishing is tilt, which means that the original surface of the integrated circuit die 12 and the polishing surface of the polishing pad 16 are allowed to form an angle other than zero in the beginning of the polishing process. The tilt angle is selected so as to allow the inclined polished surface of the integrated circuit die to be obtained after the polishing and to allow the inclined polished surface to contain at least one or a plurality of the repeating unit structures. Accordingly, the tilt angle may be not particularly limited as long as elements (or can be referred to as components) located in different layers of the integrated circuit can be shown on the inclined polished surface to provide information for the layout design. Due to the small scale of the integrated circuit, it may be preferred for the tilt angle to be greater than zero degrees and up to about 10 degrees, and more preferably from about 5 degrees to about 10 degrees. However, it should be noted that the tilt angle may be greater than 10 degrees in other embodiment. When the tilt angle is smaller, the resultant inclined polished surface may be larger and show the elements in more detail; meanwhile, it is preferred that all elements can be shown on the resultant inclined polished surface.

Figure 3:
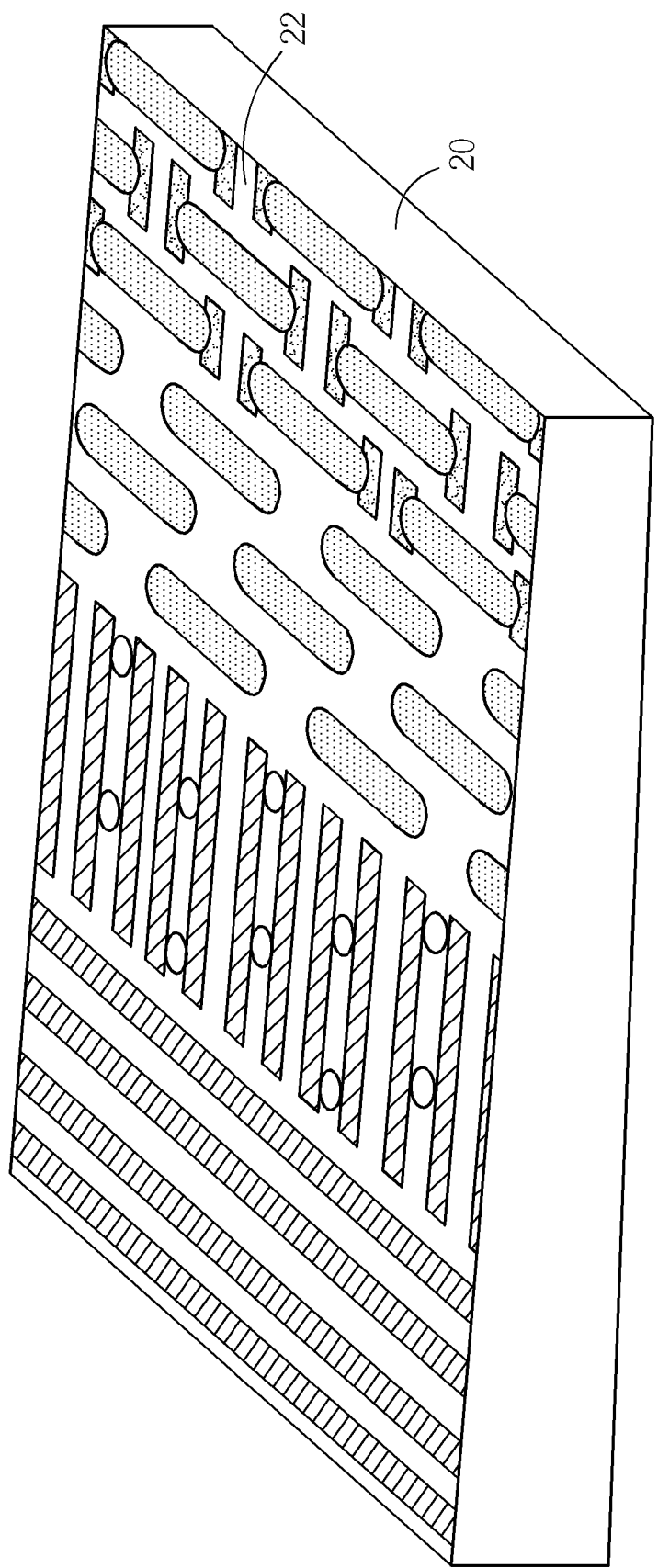
FIG. 3 is a schematic perspective view of a polished integrated circuit die according to an embodiment of the present invention.
Figure 4:
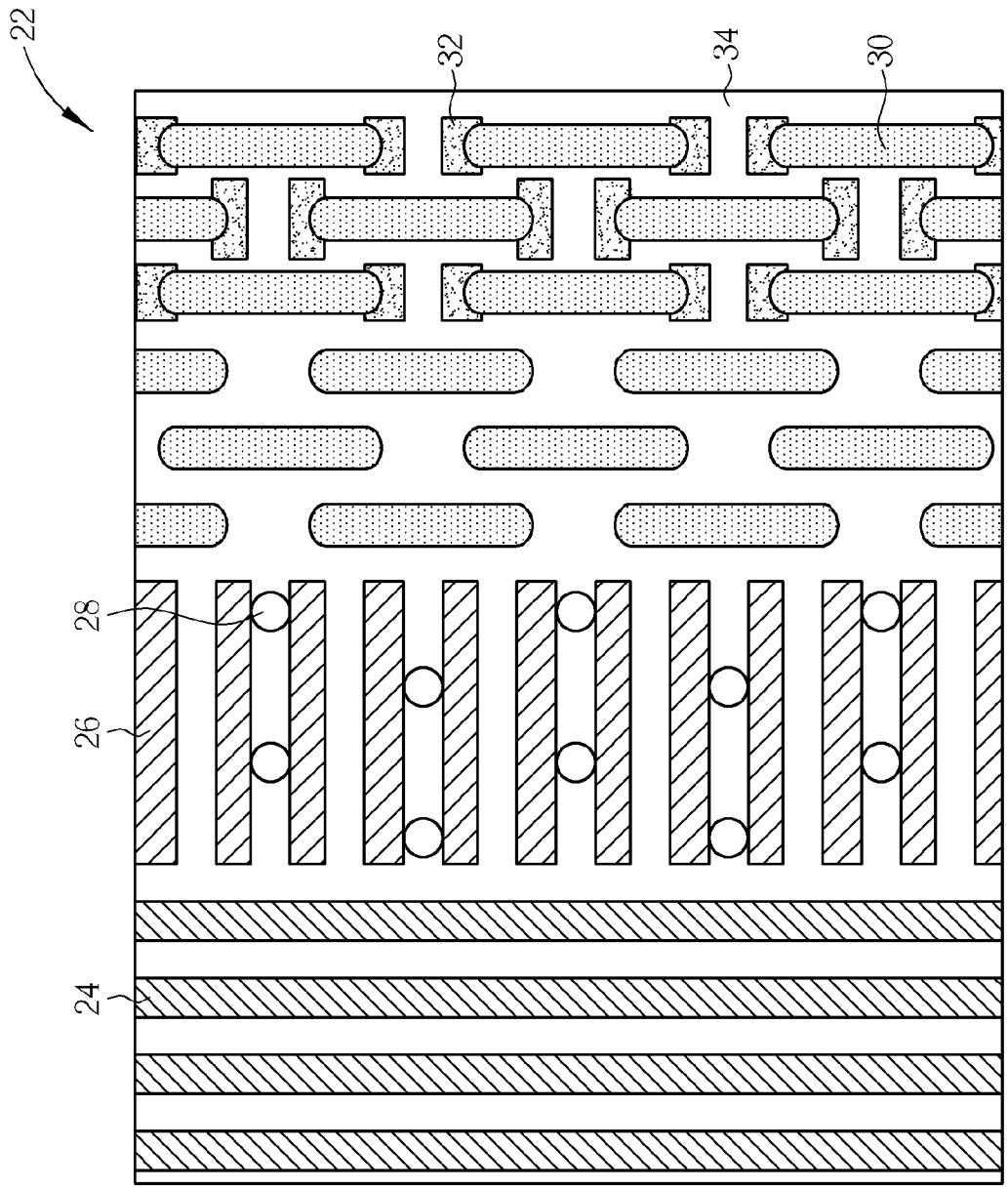
FIG. 4 is a schematic surface view of an inclined polished surface of a polished integrated circuit die according to an embodiment of the present invention.

The inclined polished surface may reveal elements in all layer of the integrated circuit, since every layer are polished and exposed as a result for a tilt polishing. FIG. 3 shows an embodiment of a polished integrated circuit die 20 which has an inclined polished surface 22. As the surface is formed in an inclined way, various elements of the integrated circuit in various altitudes (or heights or depths, depending on relative views) in the integrated circuit die are revealed from such inclined polished surface. FIG. 4 shows a schematically diagram illustrating an inclined polished surface of an integrated circuit die according to an embodiment of the present invention. From the inclined polished surface, it shows that a plurality of metal lines 24 disposed along one direction in a region which is located in a relatively thick portion of the integrated circuit die, a plurality of metal lines 26 disposed along another direction in another region at a relatively reduced height, a plurality of metal plugs 28 regularly disposed among the metal lines 26, a plurality of silicon areas 30 located at a further reduced height, and a plurality of silicon areas 30 and a plurality of silicon areas 32 located at the lowest portion of the integrated circuit die as shown in FIGS. 3 and 4. The silicon areas 32 are located at the two ends of the silicon areas 30. The areas among these elements may be judged by those skilled in the art as a dielectric filling 34.

Figure 5:
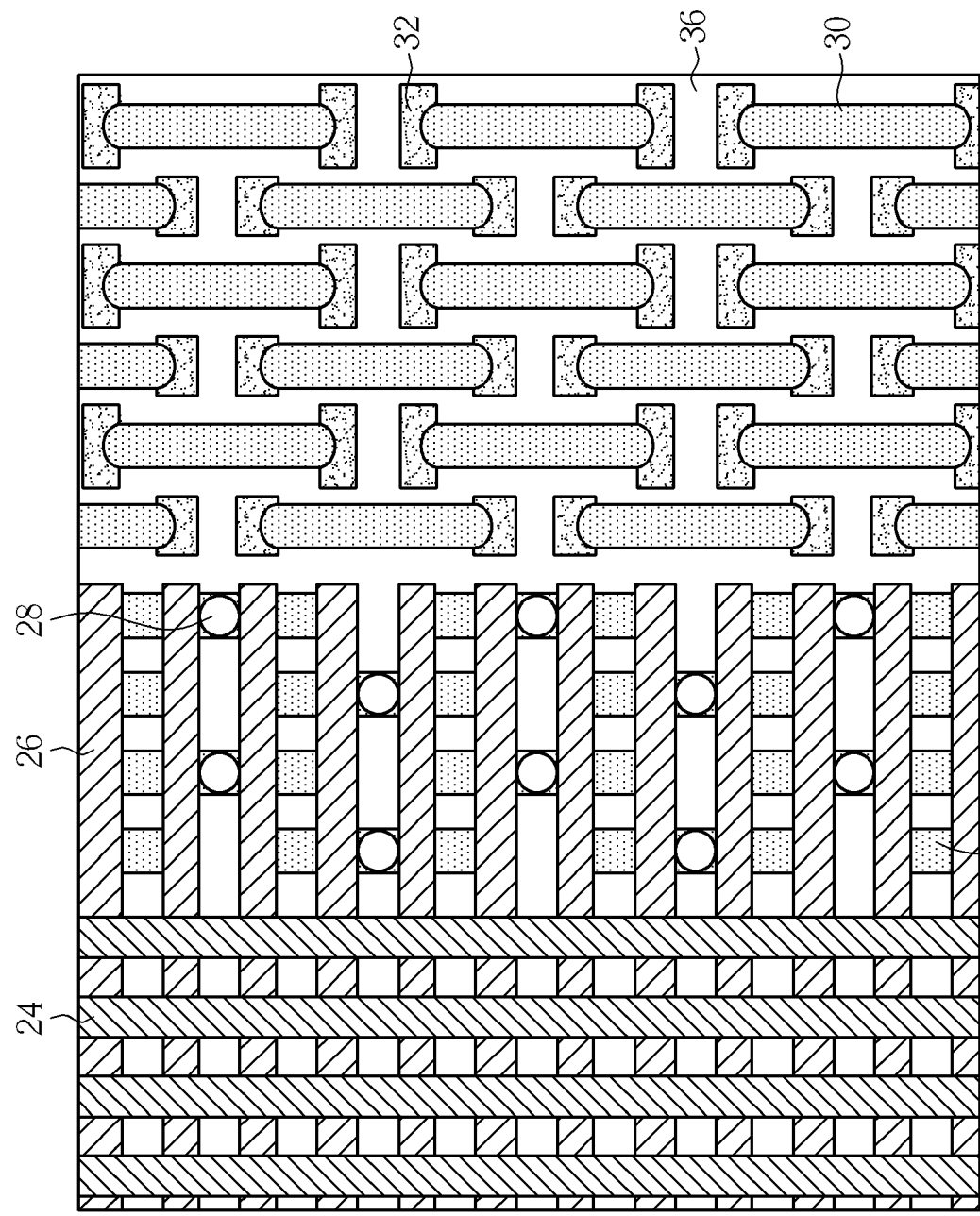
FIG. 5 is a schematic surface view of a inclined polished surface of a polished integrated circuit die after dipping according to an embodiment of the present invention.

A surface thickness of the dielectric filling 34 may be further removed, and accordingly the resultant can be shown as FIG. 5. The residual dielectric filling 36 (portions of which may be trench isolation structures) remains. After a surface thickness of the dielectric filling is removed, the elements may be more clearly revealed from the inclined polished surface. The removal of the surface thickness of the dielectric filling may be performed using an etching process. The thickness is not particularly limited as long as the image of elements on the inclined polished surface can be revealed more clearly. In one embodiment, the etching may be performed by dipping the inclined polished surface of the integrated circuit die in a suitable etchant having a selectivity to remove at least a surface thickness of the dielectric filling. The integrated circuit die can be dipped entirely or in portion. The suitable etchant may be a conventional etchant employed for removing a dielectric layer selectively. The dielectric layer may include for example oxide.

Figure 6:
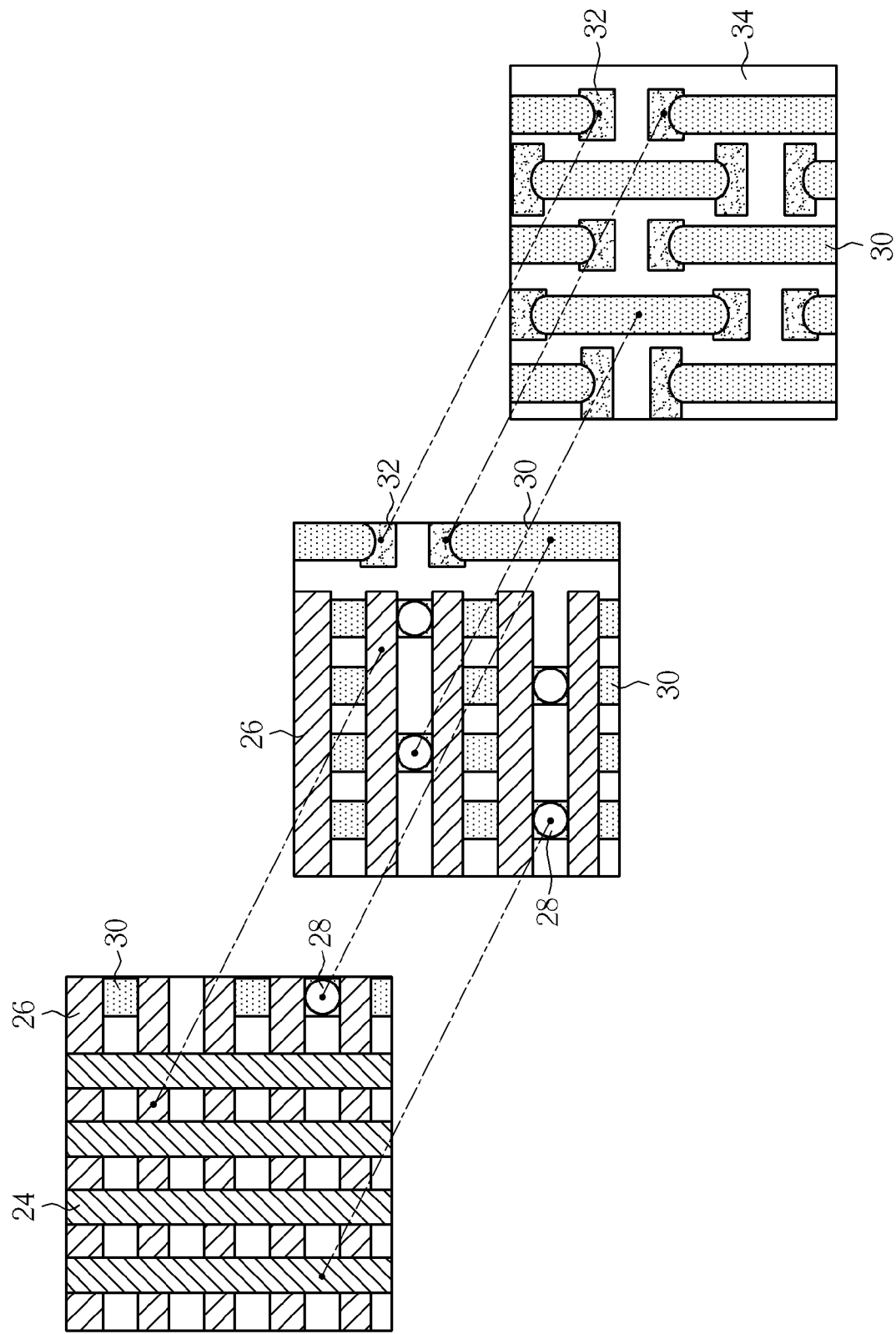
FIG. 6 is a schematic diagram illustrating overlapping the images according to an embodiment of the present invention.
Figure 7:
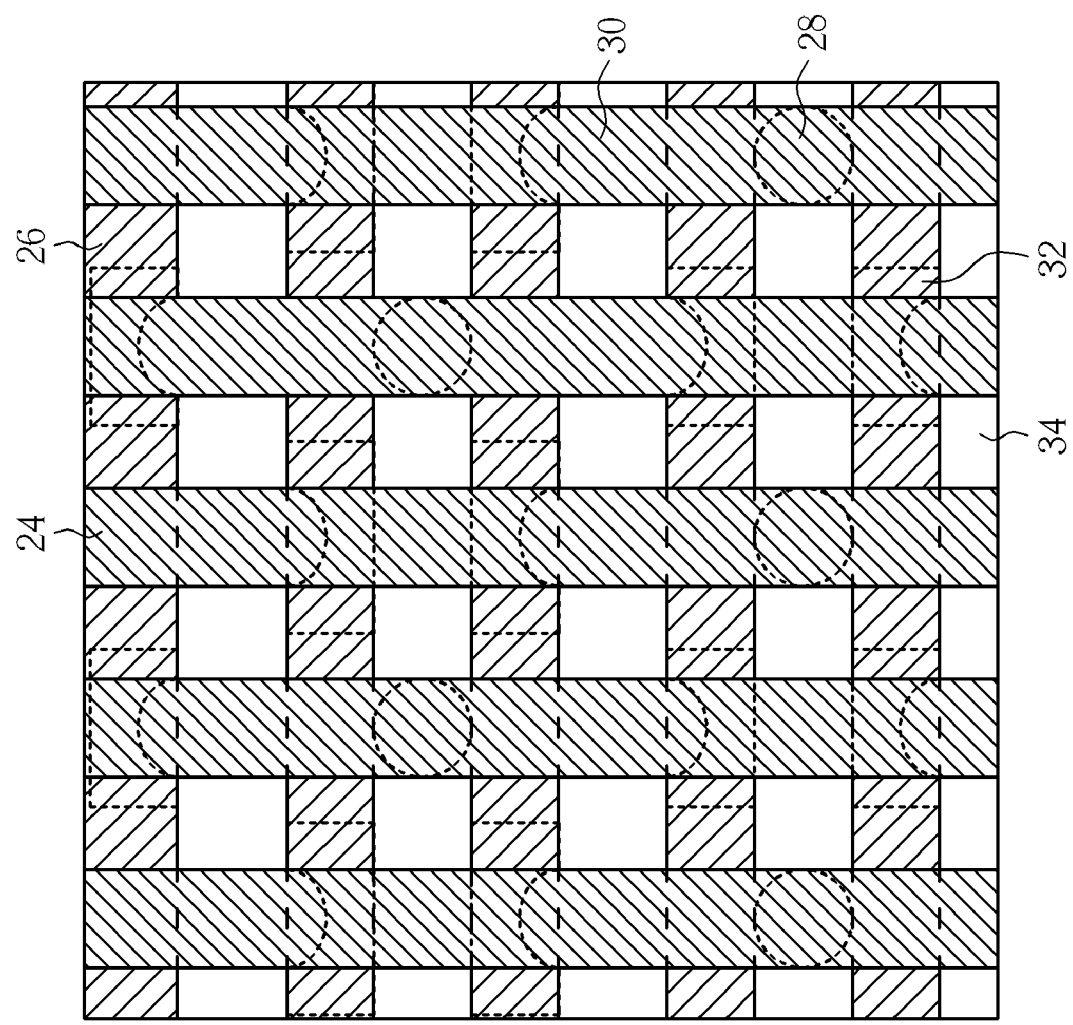
FIG. 7 is a schematic diagram illustrating that at least one repeating unit structure is obtained using the method according to an embodiment of the present invention.

After the inclined polished surface is obtained or further etched, elements, which are made of metal, silicon or others, on different locations are revealed to provide information about relative positions among elements, for example, the relative position between first metal layer and second metal layer, first metal layer and bit lines, capacitors and bit lines, active areas and bit lines, etc. Accordingly, the layout design includes at least one repeating unit structure of the layout structure of the integrated circuit may be obtained in various ways. In one embodiment, a plurality of images for various regions of the inclined polished surface may be obtained, as shown in FIG. 6. As these images may each include at least one layout of repeating unit structure of the integrated circuit with different missing elements, it is possible for simply directly overlapping the images to obtain a layout design comprising a whole layout of at least one repeating unit structure, as shown in FIG. 7. Since elements revealed by each of the images provide information of the relative positions horizontally and vertically to each other, it may be easy for those skilled in the art to make the overlap in a correct way to obtain the correct layout design.

For example, those skilled in the art may be able to recognize the metal lines 24 as bit lines since they are parallel to each other and disposed on the metal plugs 28 which are disposed on the silicon areas 30, the metal lines 26 as word lines since they are perpendicular to the metal lines 24 and go on and through the silicon areas 30 which are recognized as active areas, and the silicon areas 32 as trench capacitors since they are located at two ends of the silicon areas 30 and at the lowest portion of the integrated circuit die, by utilizing all the information which the image or images of the inclined polished surface provide.

In anther embodiment, one image taken from a region of the inclined polished surface is even sufficient to obtain a layout design, as long as the region includes a plurality of the repeating unit structures and the relative positions of the elements of repeating unit structure can be clearly shown or identified. For example, the image of FIG. 5 can provide entire information needed for those skilled in the art to obtain a layout design as shown in FIG. 7.

Figure 8:
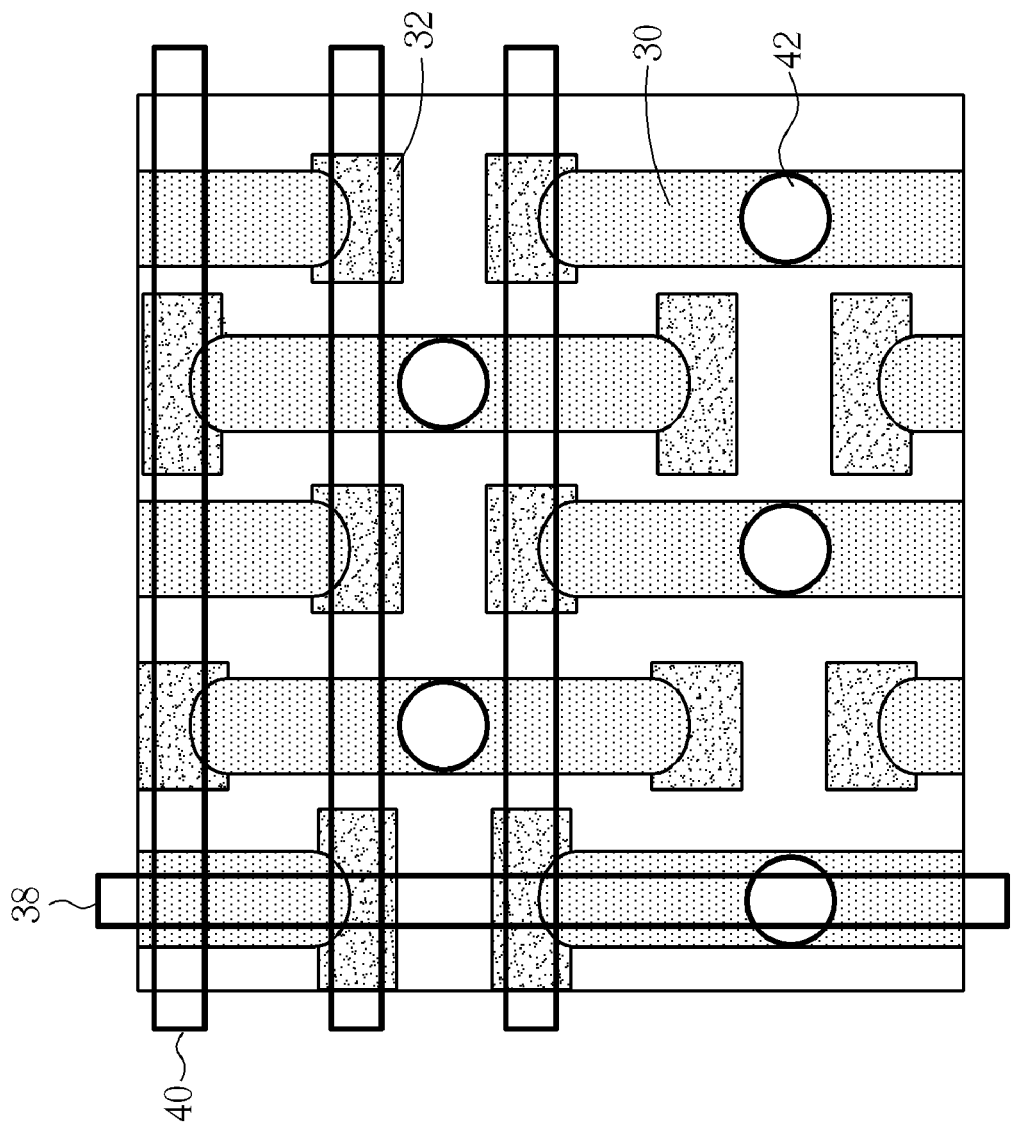
FIG. 8 is a schematic diagram illustrating that at least one repeating unit structure is obtained using the method according to another embodiment of the present invention.

In further another embodiment, a plurality of images for a plurality of regions of the inclined polished surface may be obtained. A layout design comprising at least one repeating unit structure of the layout structure may be obtained using information provided by the images. For example, at least one of the images is magnified and put on a carrier, such as a piece of paper, a computer monitor, or a digital image display, and drawing the missing portions (or elements) of the layout structure, as compared with or in accordance with the other images, on the magnified image on the carrier. Accordingly, the layout design including at least one repeating unit structure of the layout structure, as shown in FIG. 8 with drawn-on elements 38, 40, and 42, can be obtained.

The image or images of the inclined polished surface may be taken using scanning electronic microscopy (SEM) technique, but not limited thereto. The images can be put on photograph paper, even light transparent paper or screen of an image display or monitor for convenience of image overlapping.

With a suitable tilt angle, one polishing will be able to provide an image sufficient for obtaining a layout of at least one repeating structure unit. Once the inclined polished surface does not provide sufficient information or images, rework for the tilt polishing with a same tilt angle or another more suitable tilt angle can be performed on the same die, until all desired information or images are obtain. Accordingly, the method of the present invention is very time saving and easy.

Those skilled in the art will readily observe that numerous modifications and alterations of the device and method may be made while retaining the teachings of the invention.

What is claimed is:

1. A method for obtaining a layout of an existing integrated circuit, comprising:
   providing an integrated circuit die comprising an array of repeating unit structures, each repeating unit structure comprising a dielectric filling and a plurality of elements located in the dielectric filling at different depths;
   polishing the integrated circuit die with a tilt angle to form an inclined polished surface to reveal the elements from different ones of the repeating unit structures;
   obtaining a plurality of images for a plurality of regions of the inclined polished surface; and
   allowing the images to overlap each other to obtain a layout of the elements of at least one of the repeating unit structures.

2. The method for obtaining a layout of an existing integrated circuit according to claim 1, after the inclined polished surface is formed and before obtaining the images, further comprising performing an etching process on the inclined polished surface to remove a surface thickness of the dielectric filling.

3. The method for obtaining a layout of an existing integrated circuit according to claim 2, wherein the etching process comprises dipping the inclined polished surface of the integrated circuit die in an etchant for removing the surface thickness of the dielectric filling.

4. A method for obtaining a layout of an existing integrated circuit, comprising:
   providing an integrated circuit die comprising an array of repeating unit structures, each repeating unit structure comprising a dielectric filling and a plurality of elements located in the dielectric filling at different depths;
   polishing the integrated circuit die with a tilt angle to form an inclined polished surface to reveal the elements from different ones of the repeating unit structures;
   obtaining a plurality of images of a plurality of regions of the inclined polished surface; and
   obtaining a layout of the elements of at least one of the repeating unit structures using information provided by the images.

5. The method for obtaining a layout of an existing integrated circuit according to claim 4, after the inclined polished surface is formed and before obtaining the images, further comprising performing an etching process on the inclined polished surface to remove a surface thickness of the dielectric filling.

6. The method for obtaining a layout of an existing integrated circuit according to claim 5, wherein the etching process comprises dipping the inclined polished surface of the integrated circuit die in an etchant for removing the surface thickness of the dielectric filling.

7. The method for obtaining a layout of an existing integrated circuit according to claim 4, wherein, at least one of the images is magnified and put on a carrier, and a step of obtaining the layout comprising the at least one repeating unit structure of the layout structure comprises drawing missing portions of the layout structure, as compared with others of the images, on the magnified image on the carrier.

8. The method for obtaining a layout of an existing integrated circuit according to claim 7, after the inclined polished surface is formed and before obtaining the images, further comprising performing an etching process on the inclined polished surface to remove a surface thickness of the dielectric filling.

9. The method for obtaining a layout of an existing integrated circuit according to claim 8, wherein the etching process comprises dipping the inclined polished surface of the integrated circuit die in an etchant for removing the surface.

10. A method for obtaining a layout of an existing integrated circuit, comprising:
    providing an integrated circuit die comprising an array of repeating unit structures, each repeating unit structure comprising a dielectric filling and a plurality of elements located in the dielectric filling at different depths;
    polishing the integrated circuit die with a tilt angle to form an inclined polished surface to reveal the elements from different ones of the repeating unit structures;
    obtaining an image of a region of the inclined polished surface, the region comprising a plurality of the repeating unit structures; and
    obtaining a layout of the elements of at least one of the repeating unit structures using information provided by the image.

11. The method for obtaining a layout of an existing integrated circuit according to claim 10, after the inclined polished surface is formed and before obtaining the images, further comprising performing an etching process on the inclined polished surface to remove a surface thickness of the dielectric filling.

12. The method for obtaining a layout of an existing integrated circuit according to claim 11, wherein the etching process comprises dipping the inclined polished surface of the integrated circuit die in an etchant for removing the surface thickness of the dielectric filling.

* * * * *